Oct. 20, 1959 C. J. WEIDKNECHT 2,909,621

RADIO FREQUENCY AMPLIFIER

Filed July 1, 1955

INVENTOR.
CHARLES J. WEIDKNECHT
BY Edward M. Farrell
ATTORNEY 2,909,621
Patented Oct. 20, 1959

2,909,621

RADIO FREQUENCY AMPLIFIER

Charles J. Weidknecht, Philadelphia, Pa., assignor to Tele-Dynamics Inc., a corporation of Pennsylvania Application July 1, 1955, Serial No. 519,403

2 Claims. (Cl. 179—171)

This invention relates to radio frequency amplifiers, and more particularly to means for tuning the input circuits of such amplifiers.

In high frequency resonant circuits, the physical dimensions of the inductive and capacitive elements are extremely small. Due the size of these elements, a slight physical variation of either one of the elements effects a relatively large change in the resonant frequency of a circuit. The tuning of such high frequency circuits is, therefore, extremely difficult, especially when a fine degree of tuning is required.

In many types of high frequency circuits, a transmission line type of tuning is employed. In this type of tuning, a shorting device is often used to connect a pair of conductors forming the transmission line. The shorting device is adapted to be moved back and forth along the conductors to determine the tuning. Such tuning systems often introduce contact resistances between the shorting device and its associated conductors. When such contact resistances are introduced, the Q of the circuit is lowered and other undesirable effects are often introduced.

One of the major difficulties encountered in tuning high frequency circuits is caused by distributed constants associated with such circuits. These distributed constants may include stray inductances and capacitances associated with high frequency amplifier devices utilized for amplifying an input signal. For efficient operation, it is desirable to either neutralize the effects of such distributed constants or to otherwise utilize such constants in an efficient manner in associated electrical circuits.

In order to increase the power output from a high frequency transmitter, a pair of electron discharge devices connected in a push-pull arrangement is often employed. Such an arrangement necessitates an input transformer or other means providing a balanced voltage to be applied to each of the electron discharge devices. Very often, the use of imroper coupling between the input transformer windings results in a detuning of an associated resonant circuit resulting in suprious resonant responses of the circuit.

It is an object of this invention to provide a radio frequency amplifier having an improved tunable input circuit.

It is a further object of this invention to provide an improved radio frequency amplifier which makes efficient use of distributed constants.

It is still a further object of the invention to provide an improved radio frequency amplifier having a tuned input circuit wherein spurious signals are minimized.

In accordance with the present invention, a radio frequency amplifier comprising a pair of electron discharge devices having input and output circuits is provided. Each of the devices is connected in a push-pull arrangement. An input transformer having a primary winding and two secondary windings wound in a bifilar relationship is included in the input circuit of the amplifier. Each of the secondary windings has one end connected to one of the electron discharge devices with its opposite end free. Means for tuning the secondary windings are provided.

Other objects and advantages of the present invention will be apparent and suggest themselves to those skilled in the art to which the invention pertains, from a reading of the following specification in connection with the accompanying drawing. The drawing in which like parts are given like numbers include the following figures.

Figures 1, 2:
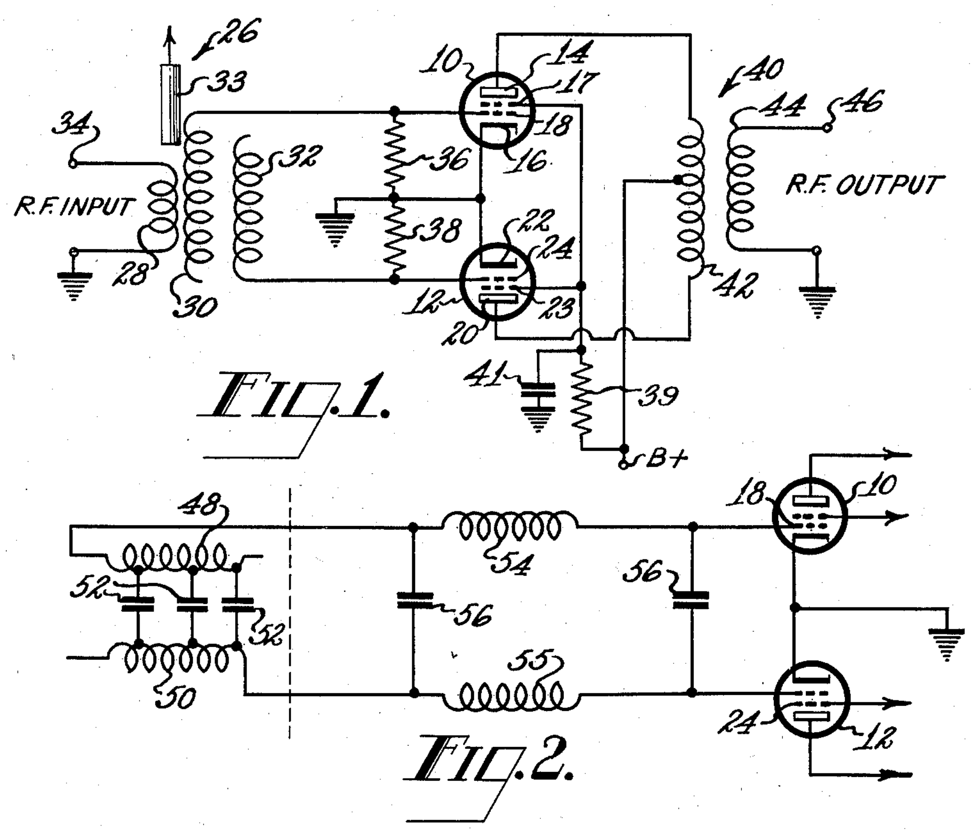
Figure 1 is a schematic circuit diagram of a radio frequency amplifier, in accordance with the present invention.
Figure 2 is a schematic equivalent circuit diagram of a portion of the input circuit shown in Figure 1.

Referring particularly to Figure 1, a pair of electron discharge devices 10 and 12 have their input and output circuits connected in push-pull relationship. The device 10 includes an anode 14, a cathode 16, a screen grid 17 and a control grid 18. The device 12 includes an anode 20, a cathode 22, a screen grid 23 and a control grid 24.

The input circuits to the device 10 and 12 include a transformer 26 having a primary winding 28 and a pair of secondary windings 30 and 32. A signal may be applied across the primary winding 28 through an input terminal 34 and a point of reference potential, designated as ground. Resistors 36 and 38 provide biasing means for the devices 10 and 12, respectively. Means for tuning the secondary windings are provided by a movable slug member 33.

The output circuits of the devices 10 and 12 includes a transformer 40 having a center tapped primary winding 42 and a secondary winding 44. An output signal from the secondary winding 44 may be applied between an output terminal 46 and ground.

Operating potential for the electron discharge devices 10 and 12 is supplied to the anodes 14 and 20 by a source, designated as B+. The screen grids 17 and 23 are connected to B+ through a resistor 39. A signal by-pass capacitor 41 is provided in the screen circuits.

It is seen that one end of each of the transformers 30 and 32 is connected to the control grids 18 and 24, respectively. The other end of each of the transformers is free and is not returned to ground. The free ends of the windings are disposed at opposite positions to provide the proper phase of the voltage applied to the control grids 18 and 24.

In operation, it was observed that a secondary winding having a free end in an input circuit of an associated amplifier or other utilization circuit provides a convenient arrangement for tuning high radio frequency circuits. With such an arrangement a large inductive element may be employed in a resonant circuit. The increased size of the inductive element permits a relatively large movement or change in the position of a tuning element, such as the slug member 33, without effecting a large variation in the resonant frequency. Exact tuning of a circuit during manufacture is, therefore, easier to attain.

Referring particularly to Figure 2, there is shown schematically an equivalent circuit of a portion of the amplifier illustrated in Figure 1. The portion of the circuit to the left of the dotted line represents the secondary windings 30 and 32 along with their distributed constants. The portion of the circuit to the right of the dotted line represents the distributed constants associated with the electron discharge devices 10 and 12.

It is seen that the tuned transformer secondary windings appears as a section of a transmission line comprising inductive elements 48 and 50 and capacitive elements 52. The grid-cathode structures of the devices 10 and 12 also appear as a section of a transmission line, represented by the distributed inductive elements 54 and 55 and the distributed capacitive elements 56.

The distributed constants associated with the transformer secondaries and the electron discharge devices are, in effect, serially connected to form a single transmission line. The electrical length of the transmission line may be varied by varying the series inductance in each of the elements 48 and 50, such as by movement of the slug member 33.

The electrical transmission line comprising the electron discharge devices and the transformer secondaries may be made any multiple of a half wave length at the desired resonant frequency. Proper tuning permits a maximum voltage to be applied to the control grids 18 and 24 of the devices 10 and 12, respectively. Balanced excitation of the transmission line is obtained by means of electromagnetic coupling from the primary winding 28 to the series inductances of the transmission lines.

Figure 3:
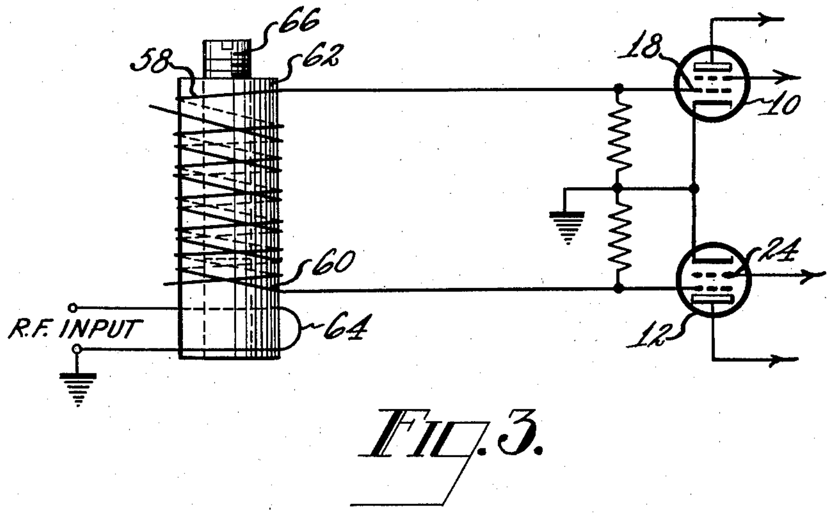
Figure 3 is a diagram, partly in the form of a schematic circuit, illustrating an input transformer utilizing bifilar windings, in accordance with the present invention.

Referring particularly to Figure 3, the secondary windings of the transformer shown in Figure 1 are in the form of a bifilar coil. The bifilar coil comprises a pair of windings 58 and 60 wound on a coil form 62. A primary winding 64 is also wound upon the coil form 62 and provides means for applying high frequency signals to the windings 58 and 60.

Permeability tuning is provided by an adjustable slug 66 adapted to be moved within the coil form 62 and between the windings 58 and 60. It is seen that one end of the winding 58 is connected to the grid 18 with its opposite end free. Likewise, one end of the winding 60 is connected to the grid 24 with its opposite end free.

The use of a bifilar coil as the secondary windings of a transformer permits very close coupling between the windings. Such close coupling minimizes any unbalance between the windings and prevents spurious resonant responses to undesired frequencies.

It has been seen that the present invention has provided a high frequency amplifier wherein tuning of an associated input circuit is attained by a relatively simple and inexpensive means. The invention has provided a high frequency amplifier making efficient use of distributed constants associated with its circuit. The push-pull arrangement, together with the use of a bifilar coil, has provided a high frequency amplifier capable of high power gain in which responses to spurious resonant signals are minimized.

In some cases, it may be desirable to use a single input stage rather than a push-pull input stage, such as shown. Also, electron discharge devices other than vacuum tube types shown may be employed.

If desired, the tuning of the transformer secondary windings may be accomplished by changing the spacing between the coil turns rather than by adjusting a slug member, such as illustrated.

What is claimed is:

1. A high frequency amplifier comprising a pair of vacuum tube devices each having an anode, a cathode and a control grid, each of said electron discharge devices further having input and output circuits connected in push-pull relationship, said input circuit including distributed constants, an input transformer having a primary winding and two closely coupled secondary bifilar windings, each of said secondary bifilar windings having one end connected to the control grid of one of said electron discharge devices and one open end, said input circuit being connected to said secondary bifilar windings whereby said distributed constants and said secondary bifilar windings form an artificial transmission line tunable to resonant frequency, said secondary bifilar windings being substantially similar to provide balanced excitation to said input circuit said secondary windings further being of a relatively large size, a movable slug member for tuning said artificial transmission line, and said movable slug member and said secondary windings being dimensioned so that a relatively large movement of said movable slug member effects a relatively small change in said resonant frequency.

2. A high frequency radio frequency amplifier comprising a pair of vacuum tube devices having input and output circuits each connected in push-pull arrangement, each of said electron discharge devices having distributed constants associated with its input circuits, an input transformer having a primary winding and two closely coupled secondary windings wound in a bifilar relationship, said two secondary windings being substantially similar to provide balanced excitation to said input circuit, each of said secondary windings being of a relatively large size and having one end connected to one of said electron discharge devices and one open end, said secondary windings having distributed constants, the distributed constants of said electron discharge devices and said secondary windings being connected to form an artificial transmission line tunable to a resonant frequency, a movable slug for tuning said artificial transmission line to vary the resonant frequency thereof, and said movable slug member and said secondary windings being dimensioned so that a relatively large movement of said movable slug member effects a relatively small change in said resonant frequency.

References Cited in the file of this patent

UNITED STATES PATENTS

| | | |
|---|---|---|
| 1,438,828 | Houck | Dec. 12, 1922 |
| 1,984,408 | Giddens | Dec. 18, 1934 |
| 2,379,168 | McClellan | June 26, 1945 |
| 2,646,467 | McIntosh | July 21, 1953 |
| 2,648,727 | Rockwell | Aug. 11, 1953 |
| 2,654,058 | McIntosh | Sept. 29, 1953 |
| 2,671,201 | Williams | Mar. 2, 1954 |
| 2,692,372 | Goldstine | Oct. 19, 1954 |
| 2,759,047 | Meachan | Aug. 14, 1956 |
| 2,860,192 | McIntosh | Nov. 11, 1958 |

OTHER REFERENCES

Publication, Proceedings of the IRE, June 1955, pp. 671–678, "An Experimental Automobile Receiver Employing Transistors," by Freedman et al.